United States Patent
Jin

(10) Patent No.: US 11,651,964 B2
(45) Date of Patent: May 16, 2023

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 204 days.

(21) Appl. No.: 17/218,785

(22) Filed: Mar. 31, 2021

(65) Prior Publication Data

US 2022/0115234 A1    Apr. 14, 2022

(30) Foreign Application Priority Data

Oct. 14, 2020   (CN) .......................... 202011094777.0

(51) Int. Cl.
*H01L 21/033*     (2006.01)
*H01L 23/522*     (2006.01)
(Continued)

(52) U.S. Cl.
CPC ...... *H01L 21/0337* (2013.01); *H01L 21/0338* (2013.01); *H01L 21/31144* (2013.01); *H01L 21/76802* (2013.01); *H01L 23/5226* (2013.01)

(58) Field of Classification Search
CPC ............. H01L 21/0337; H01L 21/0338; H01L 21/31144; H01L 21/76802; H01L 21/76816; H01L 23/5226
See application file for complete search history.

(56) References Cited

U.S. PATENT DOCUMENTS 10,192,780 B1 *   1/2019  Wang ................ H01L 21/31144
10,361,286 B2 *   7/2019  Tseng .................. H01L 29/6656
(Continued)

*Primary Examiner* — Bac H Au
(74) *Attorney, Agent, or Firm* — Crowell & Moring, L.L.P.

(57) ABSTRACT

A semiconductor structure and a forming method thereof are provided. In one form, a forming method includes: providing a base; forming a mandrel layer extending along a first direction; forming a mask spacer on a side wall of the mandrel layer; forming a first segmentation layer extending along a second direction, where the first segmentation layer is in contact with a side wall of the mask spacer along the first direction; forming a sacrificial layer arranged spaced from the mandrel layer along the second direction, where the sacrificial layer covers the side wall of the mask spacer along the first direction, and along the first direction, the sacrificial layer protrudes from two sides of the first segmentation layer and covers a part of a side wall of the first segmentation layer; forming a planarization layer on the base exposed from the sacrificial layer, the mandrel layer, the mask spacer, and the first segmentation layer; removing the sacrificial layer to form a first groove, where the first groove is segmented by the first segmentation layer along the first direction; removing the mandrel layer to form a second groove; and patterning a target layer below the first groove and the second groove by using the mask spacer, the first segmentation layer, and the planarization layer as a mask to form a target pattern. Embodiments and implementations of the present disclosure help to improve pattern precision and pattern quality of a target pattern.

11 Claims, 15 Drawing Sheets

(51) Int. Cl.
*H01L 21/311* (2006.01)
*H01L 21/768* (2006.01)

(56) References Cited

U.S. PATENT DOCUMENTS

| | | | | |
|---|---|---|---|---|
| 10,490,447 B1* | 11/2019 | Cheng | ............... | H01L 21/76849 |
| 10,692,812 B2* | 6/2020 | Srivastava | .......... | H01L 23/5226 |
| 10,991,596 B2* | 4/2021 | Jisong | ................. | H01L 21/0332 |
| 11,011,412 B2* | 5/2021 | Shi | ................... | H01L 21/31116 |
| 11,276,608 B2* | 3/2022 | Wei | ................... | H01L 21/76816 |
| 11,404,273 B2* | 8/2022 | Chen | ................. | H01L 21/0337 |
| 11,538,686 B2* | 12/2022 | Chen | ................. | H01L 21/76816 |
| 2014/0273442 A1* | 9/2014 | Liu | ................... | H01L 21/31144 |
| | | | | 438/666 |
| 2019/0103305 A1* | 4/2019 | Liu | ..................... | H01L 21/0337 |
| 2020/0373199 A1* | 11/2020 | Cheng | ................ | H01L 23/5226 |
| 2022/0115242 A1* | 4/2022 | Jin | ................... | H01L 21/31144 |
| 2022/0130672 A1* | 4/2022 | Jin | ................... | H01L 21/31144 |

* cited by examiner

SEMICONDUCTOR STRUCTURE AND FORMING METHOD THEREOF

RELATED APPLICATIONS

The present application claims priority to Chinese Patent Appln. No. 202011094777.0, filed Oct. 14, 2020, the entire disclosure of which is hereby incorporated by reference.

BACKGROUND

Technical Field

Embodiments of the present disclosure relate to the field of semiconductor manufacturing, and in particular, to a semiconductor structure and a forming method thereof.

Related Art

With the rapid growth of the semiconductor integrated circuit (IC) industry, process nodes in semiconductor technology have become increasingly small according to Moore's law. Therefore, ICs have increasingly small volumes and become increasingly precise and complex.

During the development of ICs, generally, as the functional density (that is, a quantity of interconnect structures per chip) gradually increases, the geometric size (that is, the size of the smallest component that can be produced by using process steps) gradually decreases, which accordingly increases the difficulty and complexity of IC manufacturing.

Currently, as technological nodes become increasingly small, how to increase a matching degree between a pattern formed on a wafer and a target pattern has become a challenge.

SUMMARY

A problem to be addressed by embodiments and implementations of the present disclosure is to provide a semiconductor structure and a forming method thereof, to help to improve pattern precision and pattern quality of a target pattern.

To address this problem, embodiments and implementations of the present disclosure provide a forming method of a semiconductor structure. In one form, a method includes: providing a base, including a target layer used for forming a target pattern; forming a mandrel layer extending along a first direction on the base, where a direction perpendicular to the first direction is a second direction; forming a mask spacer on a side wall of the mandrel layer; forming a first segmentation layer extending along the second direction, where the first segmentation layer is in contact with a side wall of the mask spacer along the first direction; forming a sacrificial layer extending along the first direction and arranged spaced from the mandrel layer along the second direction, where the sacrificial layer covers the side wall of the mask spacer along the first direction, and along the first direction, the sacrificial layer protrudes from two sides of the first segmentation layer and covers a part of a side wall of the first segmentation layer; forming a planarization layer on the base exposed from the sacrificial layer, the mandrel layer, the mask spacer, and the first segmentation layer; removing the sacrificial layer to form a first groove in the planarization layer, where the first groove is segmented by the first segmentation layer along the first direction; removing the mandrel layer to form a second groove in the planarization layer; and patterning the target layer below the first groove and the second groove by using the mask spacer, the first segmentation layer, and the planarization layer as a mask to form the target pattern.

The present disclosure additionally provides a semiconductor structure. In one form, a semiconductor structure includes: a base, including a target layer used for forming a target pattern; a mandrel layer, located on the base and extending along a first direction, where a direction perpendicular to the first direction is a second direction; a mask spacer, located on a side wall of the mandrel layer; a first segmentation layer, extending along the second direction, where the first segmentation layer is in contact with a side wall of the mask spacer along the first direction; a sacrificial layer, extending along the first direction and arranged spaced from the mandrel layer along the second direction, where the sacrificial layer covers the side wall of the mask spacer along the first direction, and along the first direction, the sacrificial layer protrudes from two sides of the first segmentation layer and covers a part of a side wall of the first segmentation layer; and a planarization layer, located on the base and covering the sacrificial layer, the mandrel layer, the mask spacer, and the side wall of the first segmentation layer, where the planarization layer exposes a top surface of the sacrificial layer and a top surface of the mandrel layer.

Compared to the prior art, technical solutions of embodiments and implementations of the present disclosure have at least the following advantages.

In the forming method of a semiconductor structure provided in the embodiments of the present disclosure, after the mandrel layer and the mask spacer are formed, a first segmentation layer extending along the second direction is first formed, where the first segmentation layer is in contact with a side wall of the mask spacer along the first direction, and a sacrificial layer is then formed, where along the first direction, the sacrificial layer protrudes from two sides of the first segmentation layer and covers a part of a side wall of the first segmentation layer, so that the sacrificial layer located on the two sides of the first segmentation layer is segmented by the first segmentation layer. After the sacrificial layer is removed to form a first groove, the first groove is accordingly segmented by the first segmentation layer along the first direction, which helps to implement a smaller pitch between adjacent first grooves along the first direction. After the target layer below the first groove and the second groove is patterned to form a target pattern, a smaller pitch can also be implemented at a head-to-head (HTH) position between adjacent target patterns, which helps to improve the flexibility and a degree of freedom of a layout design of the target pattern. In addition, in embodiments and implementations of the present disclosure, the first segmentation layer is formed first, and the sacrificial layer is then formed. The first segmentation layer accordingly defines a size and a position for cutting the first groove. Compared with directly segmenting the first groove through an etching process, embodiments and implementations of the present disclosure help to reduce the difficulty in segmenting the first groove and enlarge a process window for cutting the first groove, and a size of the first groove at the HTH position can be accurately controlled by adjusting a size of the first segmentation layer, thereby helping to improve the pattern precision and pattern quality of the target pattern.

In addition, in embodiments and implementations of the present disclosure, the mandrel layer is first formed, then the mask spacer is formed on a side wall of the mandrel layer, and the mask spacer is an outer spacer. After the mandrel layer is removed to form a second groove, a pitch between adjacent second grooves along the first direction is defined by the mandrel layer. Compared with forming a groove first and then forming an inner spacer on a side wall of the groove, in embodiments and implementations of the present disclosure, the pitch between adjacent second grooves along the first direction is not a sum of a pitch between adjacent mandrel layers and twice the thickness of the inner spacer, which helps to implement a smaller pitch between the adjacent second grooves along the first direction. Accordingly, after the target layer below the first groove and the second groove is patterned to form the target pattern, a smaller pitch between adjacent target patterns may be implemented at the HTH position, which helps to improve the flexibility and a degree of freedom of a layout design of the target pattern and further helps to reduce process costs.

DETAILED DESCRIPTION

Figure 1:
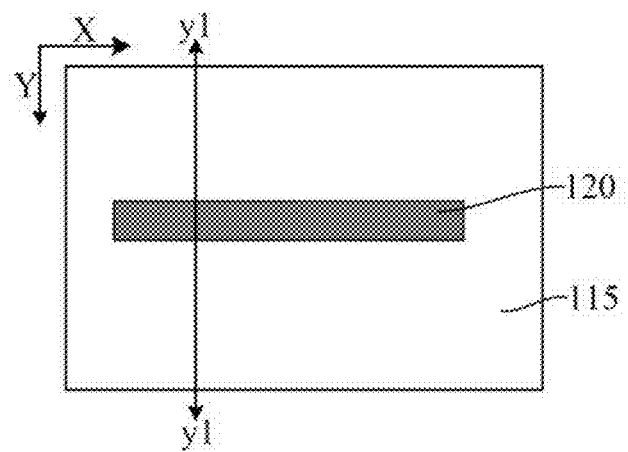
FIG. 1 to FIG. 46 are schematic structural diagrams corresponding to steps in one form of a forming method of a semiconductor structure according to the present disclosure.

As can be known from the Related Art, how to increase a matching degree between a pattern formed on a wafer and a target pattern has become a challenge. Specifically, currently, in a back end of line, a patterning process of a metal interconnect line has high difficulty and a small process window.

For example, when a shape of an interconnect pattern is relatively complex, a relatively large quantity of masks are needed for a photolithography process, resulting in relatively high process costs and relatively high difficulty in optical proximity correction processing of the masks due to the complex patterns of the masks. Consequently, the pattern precision and pattern quality of a formed interconnect line are relatively poor, and even, a problem that interconnect lines are bridged at a position at which the interconnect lines do not need to be connected is likely to be caused.

One method is to enlarge a window of the photolithography process and reduce pattern complexity of a mask by using dummy lines. When a device is working, the dummy lines are in a floating state, that is, the dummy lines are not electrically connected to an external circuit or another interconnect structure. However, the floating dummy lines may easily increase parasitic capacitance of the back end of line interconnection, resulting in poor performance of a formed semiconductor structure.

To address the technical problems, in one form of a forming method of a semiconductor structure provided in the present disclosure, after the mandrel layer and the mask spacer are formed, a first segmentation layer extending along the second direction is first formed, where the first segmentation layer is in contact with a side wall of the mask spacer along the first direction, and a sacrificial layer is then formed, where along the first direction, the sacrificial layer protrudes from two sides of the first segmentation layer and covers a part of a side wall of the first segmentation layer, so that the sacrificial layer located on the two sides of the first segmentation layer is segmented by the first segmentation layer. After the sacrificial layer is removed to form a first groove, the first groove is accordingly segmented by the first segmentation layer along the first direction, which helps to implement a smaller pitch between adjacent first grooves along the first direction. After the target layer below the first groove and the second groove is patterned to form a target pattern, a smaller pitch can also be implemented at an HTH position between adjacent target patterns, which helps to improve the flexibility and a degree of freedom of a layout design of the target pattern. In addition, in embodiments and implementations of the present disclosure, the first segmentation layer is first formed, and the sacrificial layer is then formed. The first segmentation layer accordingly defines a size and a position for cutting the first groove. Compared with directly segmenting the first groove through an etching process, embodiments and implementations of the present disclosure help to reduce the difficulty in segmenting the first groove and enlarge a process window for cutting the first groove, and a size of the first groove at the HTH position can be accurately controlled by adjusting a size of the first segmentation layer, thereby helping to improve the pattern precision and pattern quality of the target pattern.

To make the foregoing objectives, features, and advantages of the embodiments and implementations of the present disclosure more comprehensible, specific embodiments and implementations of the present disclosure are described below in detail with reference to the accompanying drawings. FIG. 1 to FIG. 46 are schematic structural diagrams corresponding to steps in one form of a forming method of a semiconductor structure according to the present disclosure.

Figure 2:
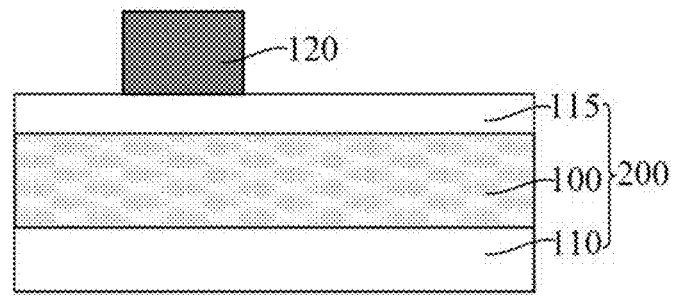

Referring to FIG. 1 and FIG. 2, FIG. 2 is a cross-sectional view of FIG. 1 along a section line y1-y1. A base 200 is provided, including a target layer 100 used for forming a target pattern.

The base 200 is configured to provide a platform for subsequent process procedures. The target layer 100 is a to-be-patterned film layer for forming the target pattern. The target pattern may be a pattern such as a gate structure, an interconnect trench in the back end of line, a fin in a fin field-effect transistor (FinFET), a channel stack in a gate-all-around (GAA) transistor or a forksheet transistor, or a hard mask (HM) layer.

In this form, the target layer 100 is a dielectric layer. Subsequently, the dielectric layer is patterned, a plurality of interconnect trenches is formed in the dielectric layer, and then interconnect lines are formed in the interconnect trenches, where the dielectric layer is configured to implement electrical isolation between adjacent interconnect lines. Accordingly, in this form, the target pattern is an interconnect trench. Therefore, the dielectric layer is an inter metal dielectric (IMD) layer. A material of the dielectric layer is a low-k dielectric material, an ultra low-k dielectric material, silicon oxide, silicon nitride, silicon oxynitride, or the like.

Accordingly, semiconductor devices, such as a transistor and a capacitor, may be formed in the base 200, and functional structures, such as a resistance structure and a conductive structure, may also be formed in the base 200. In this form, the base 200 further includes a substrate 110 located at a bottom of the target layer 100. In an example, the substrate 110 is a silicon substrate.

In this form, the base 200 further includes a hard mask material layer 115 located above the target layer 100. Subsequently, the hard mask material layer 115 is first patterned to form a hard mask layer, and then the target layer 100 is patterned using the hard mask layer as a mask, which helps to improve the process stability of patterning the target layer 100 and pattern transfer precision.

A material of the hard mask material layer 115 includes one or more of titanium nitride, tungsten carbide, silicon oxide, silicon oxycarbide, and silicon oxycarbonitride. In an example, the material of the hard mask material layer 115 is titanium nitride.

In a specific process, according to an actual process requirement, a stress buffer layer may be further disposed between the hard mask material layer 115 and the target layer 100 to improve the adherence between the hard mask material layer 115 and the target layer 100 and reduce a stress generated between film layers. In addition, an etch stop layer may be disposed between the hard mask material layer 115 and the stress buffer layer and disposed on the hard mask material layer 115 to define a stop position of a subsequent etching process, which helps to improve an effect of a subsequent patterning process. Related descriptions of the stress buffer layer and the etch stop layer are not described in detail in this form.

Still referring to FIG. 1 and FIG. 2, a mandrel layer 120 extending along a first direction (as shown by a direction X in FIG. 1) is formed on the base 200, and a direction perpendicular to the first direction is a second direction (as shown by a direction Y in FIG. 1).

The mandrel layer 120 is configured to occupy a spatial position for formation of a second groove to subsequently define a pattern and a position of the second groove. Compared with directly forming the second groove through an etching process, in this form, the mandrel layer 120 is first formed, and the mandrel layer 120 is subsequently removed to form the second groove, so that a size and a shape of the second groove may be accurately controlled by adjusting a size and a shape of the mandrel layer 120, which helps to reduce difficulty in forming the second groove and ensuring the pattern precision of the second groove. Accordingly, after the target layer 100 below the second groove is subsequently etched to form the target pattern, the pattern precision of the target pattern may be improved. Subsequently, a mask spacer is formed on a side wall of the mandrel layer 120, and the mandrel layer 120 further provides support for formation of the mask spacer.

In this form, a material of the mandrel layer 120 is a material that may be easily removed, thereby reducing the difficulty in removing the mandrel layer 120 subsequently. The mandrel layer 120 is a single-layer structure or a multiple-layer structure, and the material of the mandrel layer 120 includes one or more of amorphous silicon, polysilicon, silicon oxide, amorphous carbon, silicon nitride, amorphous germanium, silicon oxynitride, carbon nitride, silicon carbonitride, and silicon oxycarbonitride. In an example, the mandrel layer 120 is a single-layer structure, and the material of the mandrel layer 120 is amorphous silicon.

Figure 3:
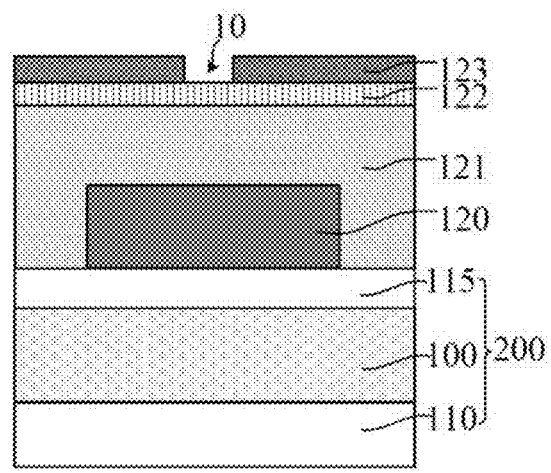
Figure 4:
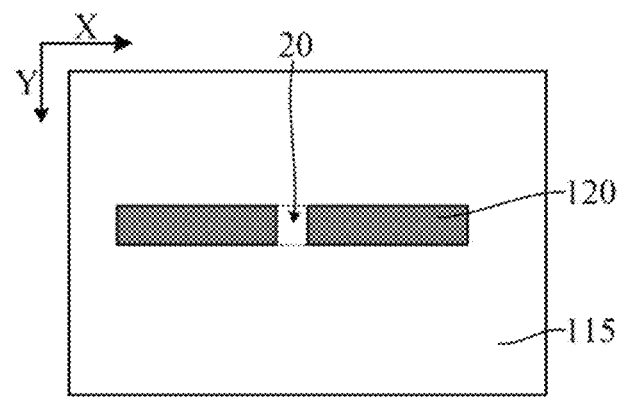
Figure 5:
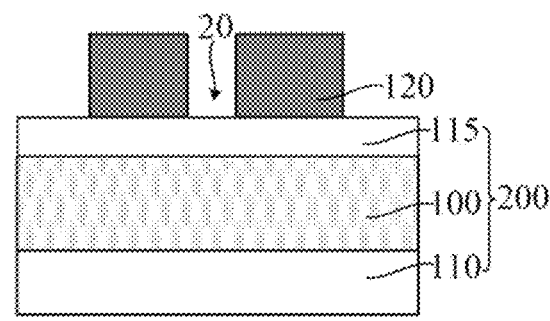

Referring to FIG. 3 to FIG. 5, in this form, after the mandrel layer 120 is formed, the forming method of a semiconductor structure further includes: forming a cutting groove 20 running through the mandrel layer 120 along the second direction, where the mandrel layer 120 is segmented by the cutting groove 20 along the first direction.

The cutting groove 20 is configured to segment the mandrel layer 120 along the first direction, to implement a smaller pitch between adjacent mandrel layers 120 along the first direction and implement a smaller pitch between adjacent target patterns at the HTH position. The cutting groove 20 is further configured to provide a spatial position for formation of a second segmentation layer.

In this form, the step of forming the cutting groove 20 includes the following steps.

FIG. 3 shows a cross-sectional view at the position of the mandrel layer 120 along the first direction. A pattern layer (not marked) covering the mandrel layer 120 is formed on the base 200, and includes a filling layer 121, a first anti-reflective coating 122, and a first photoresist layer 123 sequentially stacked from bottom to top, and a first pattern opening 10 is formed in the first photoresist layer 123. The pattern layer is used as a mask for etching the mandrel layer 120.

The filling layer 121 is configured to provide a flat surface for forming the first anti-reflective coating 122 and the first photoresist layer 123. In this form, a material of the filling layer 121 is spin-on carbon (SOC).

The first anti-reflective coating 122 is configured to reduce a reflection effect during exposure, thereby improving pattern transfer precision. In this form, the first anti-reflective coating is a Si-ARC layer, and the Si-ARC layer helps to increase the exposure depth of field (DOF) during the photolithography process, thereby helping to improve exposure uniformity. In other forms, the material of the first anti-reflective coating may alternatively be a BARC material.

The first photoresist layer 123 is used as a mask for etching the first anti-reflective coating 122, the filling layer 121, and the mandrel layer 120. The photoresist layer 123 is formed through photolithography processes such as exposure and development.

As shown in FIG. 4 and FIG. 5, FIG. 5 is a cross-sectional view of FIG. 4 at the position of the mandrel layer 120 along the first direction. The first photoresist layer 123 is used as a mask for etching the first anti-reflective coating 122, the filling layer 121, and the mandrel layer 120 sequentially along the first pattern opening 10, to form the cutting groove 20 in the mandrel layer 120; and the pattern layer is removed.

In this form, the first anti-reflective coating layer 122, the filling layer 121, and the mandrel layer 120 are sequentially etched using an anisotropic dry etching process. The anisotropic dry etching process has the characteristic of anisotropic etching to improve pattern transfer precision.

In this form, the pattern layer is removed at least one of an ashing process or a wet stripping process.

In other forms, after the mandrel layer is formed, and before the mask spacer is formed, the forming method of a semiconductor structure further includes: performing ion doping on a part of the mandrel layer, where the ion doping is adapted to improve etching resistance of the mandrel layer, and the ion-doped mandrel layer is used as a second segmentation layer; and the mandrel layer is segmented by the second segmentation layer along the first direction. The ion doping is adapted to improve the etching resistance of the mandrel layer, accordingly, the etching resistance of the second segmentation layer is greater than the etching resistance of the mandrel layer, and an etching selectivity ratio between the mandrel layer and the second segmentation layer is accordingly increased, so that the second segmentation layer can be reserved in a subsequent process of removing the mandrel layer to form the second groove, and the second segmentation layer can segment the second groove. Specifically, an ion of the ion doping includes one or more of a boron ion, a phosphorus ion, and an argon ion.

Figure 6:
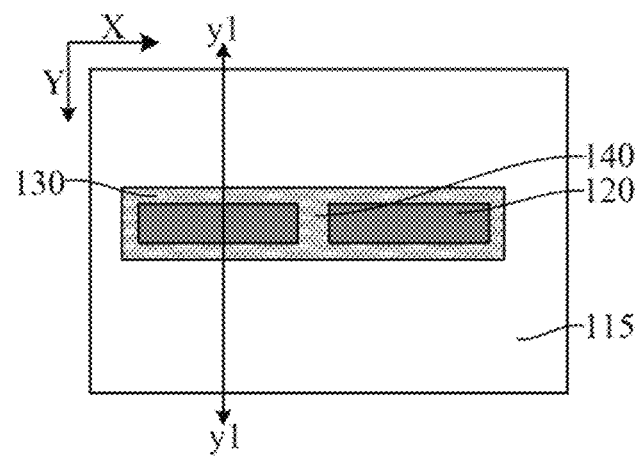
Figure 7:
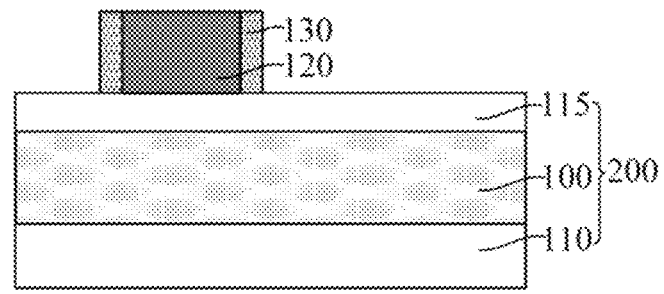
Figure 8:
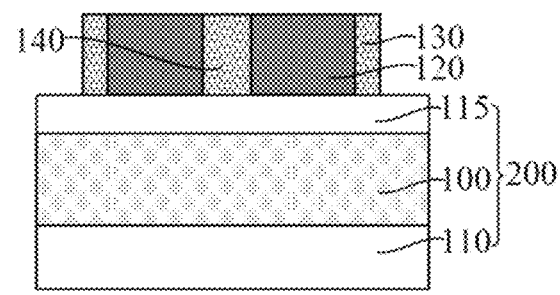

Referring to FIG. 6 to FIG. 8, FIG. 7 is a cross-sectional view of FIG. 6 along the section line y1-y1, and FIG. 8 is a cross-sectional view of FIG. 6 at the position of the mandrel layer 120 along the first direction. A mask spacer 130 is formed on the side wall of the mandrel layer 120. The mask spacer 130 is used as a mask for subsequently patterning the target layer 100.

A first groove and a second groove are subsequently formed, and the mask spacer 130 is further configured to isolate the first groove and the second groove that are adjacent to each other. In addition, in this form, a pitch between the first groove and the second groove may be further made to meet a designed minimum space by adjusting a thickness of the mask spacer 130 subsequently.

In this form, the mandrel layer 120 is first formed, then the mask spacer 130 is formed on a side wall of the mandrel layer 120, and the mask spacer 130 is an outer spacer. After the mandrel layer 120 is removed to form a second groove, a pitch between adjacent second grooves along the first direction is defined by the mandrel layer 120. Compared with forming a groove first and then forming an inner spacer on a side wall of the groove, in this form, the pitch between adjacent second grooves along the first direction is not a sum of a pitch between adjacent mandrel layers and twice the thickness of the inner spacer, which helps to implement a smaller pitch between the adjacent second grooves along the first direction. Accordingly, after the target layer below the first groove and the second groove is patterned to form the target pattern, a smaller pitch between adjacent target patterns may be implemented at the HTH position, which helps to improve the flexibility and a degree of freedom of a layout design of the target pattern and further helps to reduce process costs.

In this form, the mask spacer 130 is filled in the cutting groove 20, and the mask spacer 130 located in the cutting groove 20 is used as a second segmentation layer 140. After the mandrel layer 120 is subsequently removed to form a second groove, the second segmentation layer 140 is configured to segment the second groove along the first direction.

The mask spacer 130 is made of a material that has etching selectivity with the mandrel layer 120 and the target layer 100, and the material of the mask spacer 130 includes one or more of titanium oxide, silicon oxide, silicon nitride, silicon carbide, silicon oxycarbide, aluminum oxide, and amorphous silicon.

In this form, a process forming the mask spacer 130 includes an atomic layer deposition process, which helps to improve thickness uniformity of the mask spacer 130 and makes it easy to perform accurate control of the thickness of the mask spacer 130.

Referring to FIG. 9 to FIG. 22, a first segmentation layer 170 extending along the second direction is formed, and the first segmentation layer 170 is in contact with a side wall of the mask spacer 130 along the first direction.

The first segmentation layer 170 is configured to segment a subsequent sacrificial layer along the first direction, so that after the sacrificial layer is subsequently removed to form a first groove, the first groove is accordingly segmented by the first segmentation layer 170 along the first direction, which helps to implement a smaller pitch between adjacent first grooves along the first direction. After the target layer 100 below the first groove and the second groove is patterned to form a target pattern, a smaller pitch can also be implemented at the HTH position between adjacent target patterns, which helps to improve the flexibility and a degree of freedom of a layout design of the target pattern. Compared with directly segmenting the first groove through an etching process, this form helps to reduce the difficulty in segmenting the first groove and enlarge a process window for cutting the first groove, and a size of the first groove at the HTH position can be accurately controlled by adjusting a size of the first segmentation layer 170, thereby helping to improve the pattern precision and pattern quality of the target pattern.

In this form, along the second direction, the first segmentation layer 170 further extends to cover a part of a top portion of the mask spacer 130 and a part of a top portion of the mandrel layer 120. That is, the first segmentation layer 170 performs overcutting, which not only helps to lower a size precision requirement for the first segmentation layer 170 along the second direction, but also helps to avoid a problem that the second segmentation layer cannot effectively segment the sacrificial layer.

Therefore, the first segmentation layer 170 is made of a material that has etching selectivity with the mandrel layer 120 and the subsequent sacrificial layer. In this form, the material of the first segmentation layer 170 includes one or more of silicon oxide, metal oxide (for example, titanium oxide), polysilicon, and amorphous silicon. In an example, the material of the first segmentation layer 170 is silicon oxide.

In this form, the step of forming the first segmentation layer 170 includes the following steps.

Figure 9:
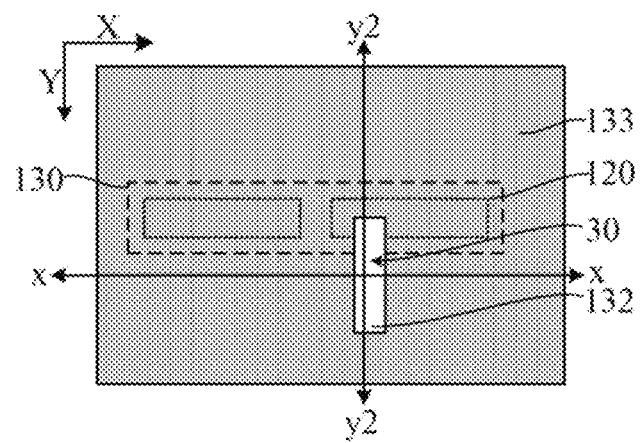
Figure 10:
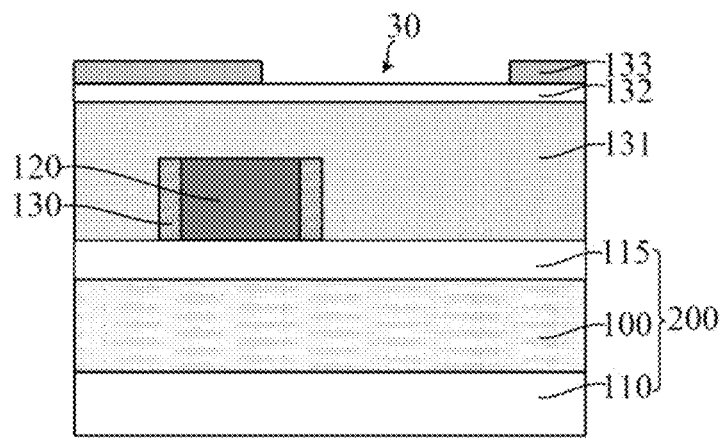
Figure 11:
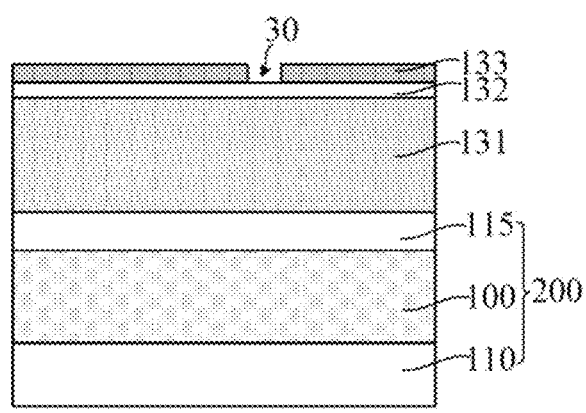

As shown in FIG. 9 to FIG. 11, FIG. 10 is a cross-sectional view of FIG. 9 along a section line y2-y2, and FIG. 11 is a cross-sectional view of FIG. 9 along a section line x-x. A support layer 131 is formed on the base 100 exposed from the mandrel layer 120 and the mask spacer 130. The support layer 131 is configured to subsequently form a cutting opening, and after the cutting opening is formed, the support layer 131 is configured to provide support to formation of the first segmentation layer in the cutting opening.

Subsequently, after the first segmentation layer is formed, the support layer 131 is further removed. Therefore, the support layer 131 is made of a material that can be easily removed, to reduce the difficulty in removing the support layer 131. In this form, a material of the support layer 131 is SOC. SOC is applicable to a spin coating process, and helps to reduce the difficulty in forming the support layer 131 and improve the flatness of the top surface of the support layer 131. SOC can be easily removed.

In other forms, the material of the support layer may further include one or more of an organic dielectric layer (ODL), a bottom anti-reflective coating (BARC), a silicon anti-reflective coating (Si-ARC), a deep UV light absorbing oxide (DUO) layer, a dielectric anti-reflective coating (DARC), and an advanced patterning film (APF). Accordingly, in this form, the support layer 131 is formed by using a spin coating process.

In this form, after the support layer 131 is formed, the forming method further includes: forming a second anti-reflective coating 132 on the support layer 131; and forming a second photoresist layer 133 on the second anti-reflective coating 132, where a second pattern opening 30 is formed in the second photoresist layer 133.

The second photoresist layer 133 is configured to define a size and a position of a cutting opening. The second anti-reflective coating layer 132 is configured to reduce a reflection effect during exposure. In this form, a material of the second anti-reflective coating 132 is a BARC.

Figure 12:
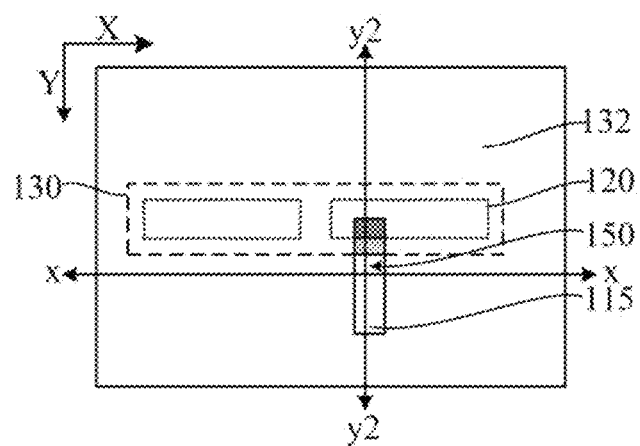
Figure 13:
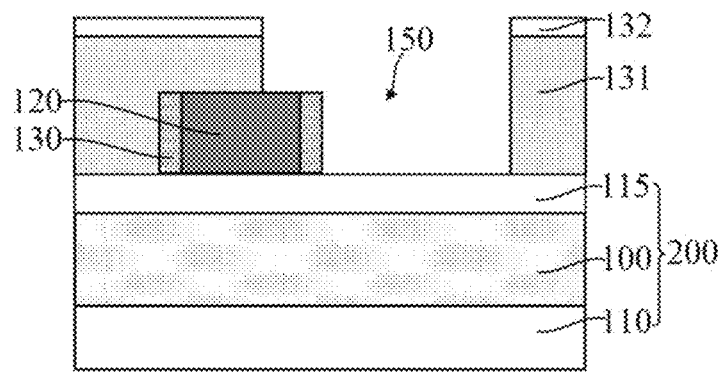
Figure 14:
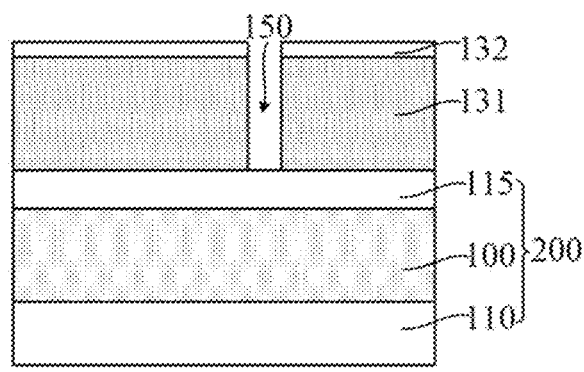

As shown in FIG. 12 to FIG. 14, FIG. 13 is a cross-sectional view of FIG. 12 along the section line y2-y2, and FIG. 14 is a cross-sectional view of FIG. 12 along the section line x-x. A cutting opening 150 extending along the second direction is formed in the support layer 131, and the cutting opening 150 exposes a part of a side wall of the mask spacer 130 along the first direction and a part of the base 200. The cutting opening 150 is configured to define a size and a position of the first segmentation layer.

In this form, the cutting opening 150 further exposes parts of top portions and parts of side walls of the mask spacer 130 and the mandrel layer 120. In this form, the step of forming the cutting opening 150 includes: etching the second anti-reflective coating 132 and the support layer 131 sequentially along the second pattern opening 30 by using the second photoresist layer 133 as a mask to form the cutting opening 150 in the support layer 131.

In this form, the second anti-reflective coating 132 and the support layer 131 are sequentially etched by using an anisotropic dry etching process, which helps to improve pattern transfer precision. In this form, in the step of etching the second anti-reflective coating 132 and the support layer 131, the second photoresist layer 133 is gradually consumed. Therefore, after the cutting opening 150 is formed, the second photoresist layer 133 has been removed.

As shown in FIG. 15 to FIG. 19, the first segmentation layer 170 is formed in the cutting opening 150.

Figure 15:
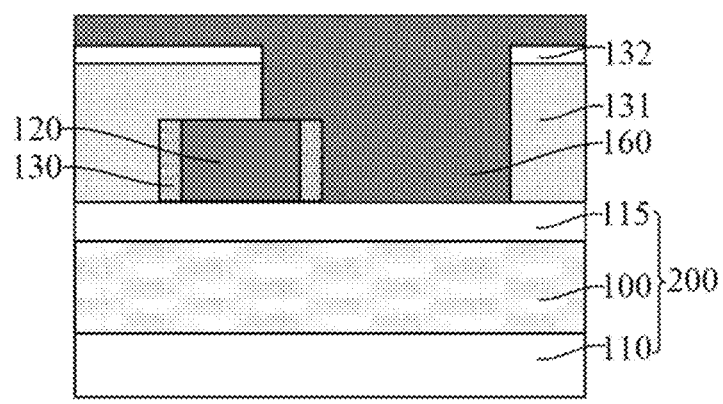
Figure 16:
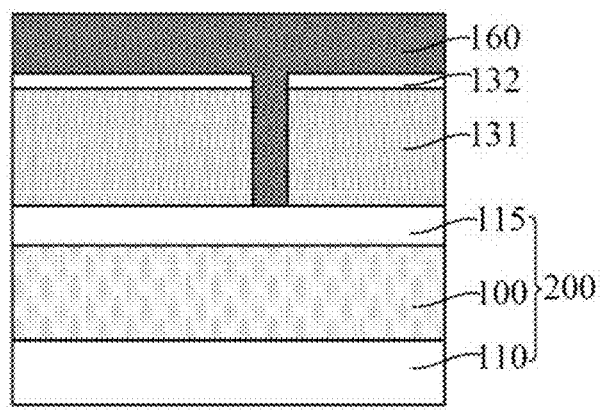
Figure 17:
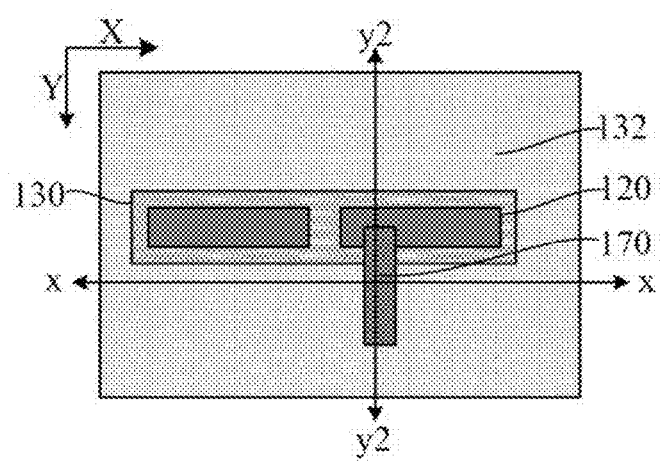
Figure 18:
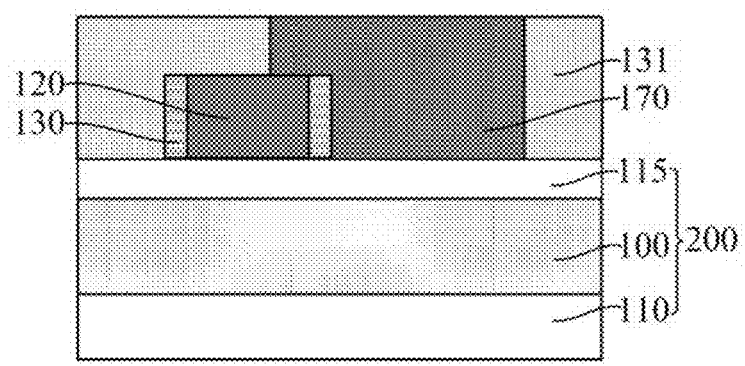
Figure 19:
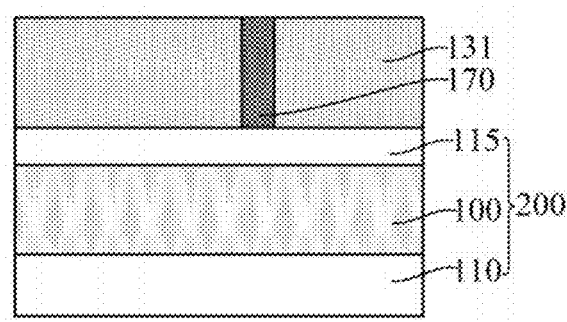

Specifically, the step of forming the first segmentation layer 170 includes: as shown in FIG. 15 and FIG. 16, where FIG. 15 is a cross-sectional view based on FIG. 13, and FIG. 16 is a cross-sectional view based on FIG. 14, forming a segmentation material layer 160 in the cutting opening 150, where the segmentation material layer 160 further covers the second anti-reflective coating 132; and as shown in FIG. 17 to FIG. 19, where FIG. 18 is a cross-sectional view of FIG. 17 along the section line y2-y2, and FIG. 19 is a cross-sectional view of FIG. 17 along the section line x-x, removing the segmentation material layer 160 higher than the support layer 131, and using the segmentation material layer 160 remained in the cutting opening 150 as the first segmentation layer 170.

A process of forming the first segmentation layer 170 includes one or more of a spin coating process, an atomic layer deposition process, and a chemical vapor deposition process. In this form, the segmentation material layer 160 is formed through a spin coating process.

In this form, the segmentation material layer 160 higher than the support layer 131 is removed by using an etching process (for example, an anisotropic dry etching process). In this form, in the step of removing the segmentation material layer 160 higher than the support layer 131, the second anti-reflective coating 132 is also removed.

Figure 20:
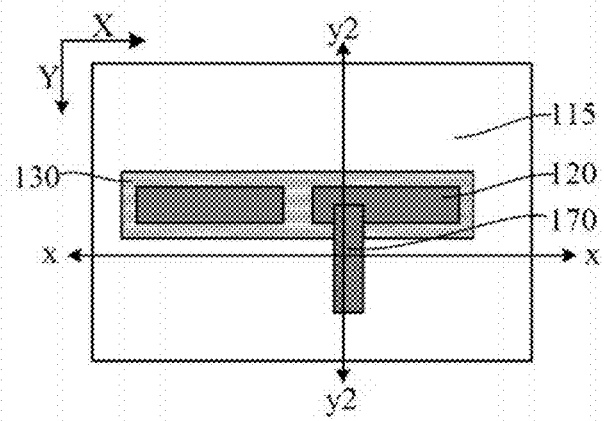
Figure 21:
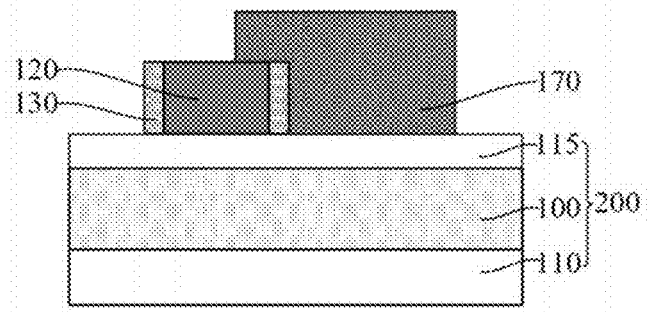
Figure 22:
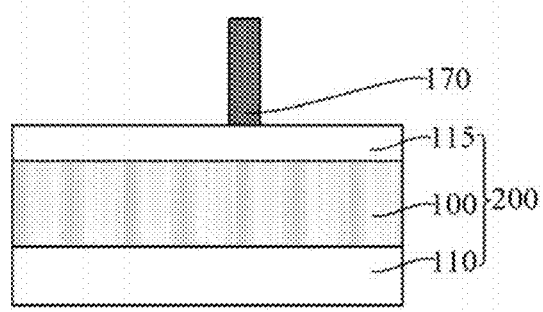

As shown in FIG. 20 to FIG. 22, FIG. 21 is a cross-sectional view of FIG. 20 along the section line y2-y2, and FIG. 22 is a cross-sectional view of FIG. 20 along the section line x-x. The support layer 131 is removed.

The support layer 131 is removed to help to form a sacrificial layer subsequently. In this form, the support layer 131 is removed by using one or two of an ashing process and a wet stripping process.

Referring to FIG. 23 to FIG. 30, a sacrificial layer 180 extending along the first direction and arranged spaced from the mandrel layer 120 along the second direction is formed, where the sacrificial layer 180 covers the side wall of the mask spacer 130 along the first direction, and along the first direction, the sacrificial layer 180 protrudes from two sides of the first segmentation layer 170 and covers a part of a side wall of the first segmentation layer 170.

The sacrificial layer 180 is configured to occupy space for formation of a first groove, and accordingly, the sacrificial layer 180 is configured to define a pattern and a position of the first groove. Compared with a solution of directly forming the first groove through an etching process, subsequently removing the sacrificial layer 180 to form the first groove helps to reduce the difficulty in forming the first groove, and accordingly helps to ensure the pattern precision of the first groove.

In this form, the sacrificial layer 180 is segmented by the first segmentation layer 170 along the first direction, so that after the sacrificial layer 180 is subsequently removed to form a first groove, the first groove is accordingly segmented by the first segmentation layer 170 along the first direction, which helps to implement a smaller pitch between adjacent first grooves along the first direction. After the target layer 100 below the first groove and the second groove is patterned to form a target pattern, a smaller pitch can also be implemented at the HTH position between adjacent target patterns.

In this form, the mandrel layer 120 and the mask spacer 130 located on the side wall of the mandrel layer 120 are first formed, and then the sacrificial layer 180 is formed. Accordingly, the sacrificial layer 180 and the mandrel layer 120 can be isolated by the mask spacer 130, which helps to make a pitch between the sacrificial layer 180 and the mandrel layer 120 meet the designed minimum space, and accordingly make a pitch between the second groove and the first groove meet the designed minimum space.

In addition, in this form, the mandrel layer 120 and the sacrificial layer 180 are respectively formed in different steps, and patterns of the first groove and the second groove are defined by the mandrel layer 120 and the sacrificial layer 180, which accordingly helps to reduce the difficulty in forming the first groove and the second groove, further helps to improve the pattern precision of the first groove and the second groove, and accordingly helps to make the target pattern have relatively high pattern precision when the target layer 100 below the first groove and the second groove is subsequently etched to form the target pattern.

The sacrificial layer 180 is a single-layer structure or a laminated structure, and a material of the sacrificial layer 180 includes one or more of SOC, silicon oxide, metal oxide, an organic dielectric layer material, and an advanced patterning film material. The silicon oxide includes spin-on-glass (SOG); and the metal oxide includes spin-on metal oxide. The material of the sacrificial layer 180 is applicable to a spin coating process, which helps to reduce the difficulty in forming the sacrificial layer 180 and improve the flatness of the top surface of the sacrificial layer 180. In this form, the material of the sacrificial layer 180[SU1] is SOC. The filling performance of SOC is relatively good, and SOC material may be easily etched, which helps to reduce the difficulty in forming the sacrificial layer 180.

In this form, in the step of forming the sacrificial layer 180, the sacrificial layer 180 further covers a part of a top portion of the first segmentation layer 170.

In an example, the step of forming the sacrificial layer 180 includes the following steps.

Figure 23:
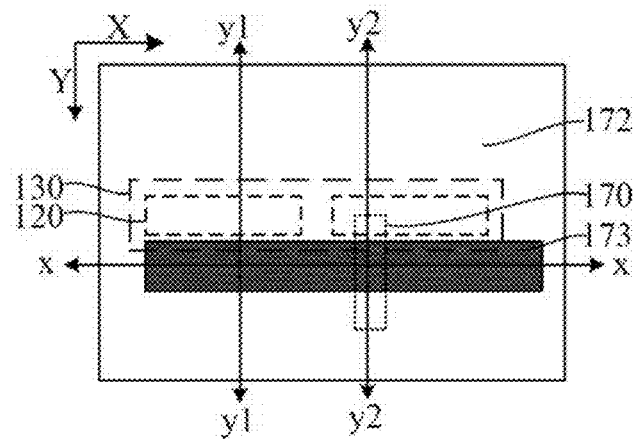
Figure 24:
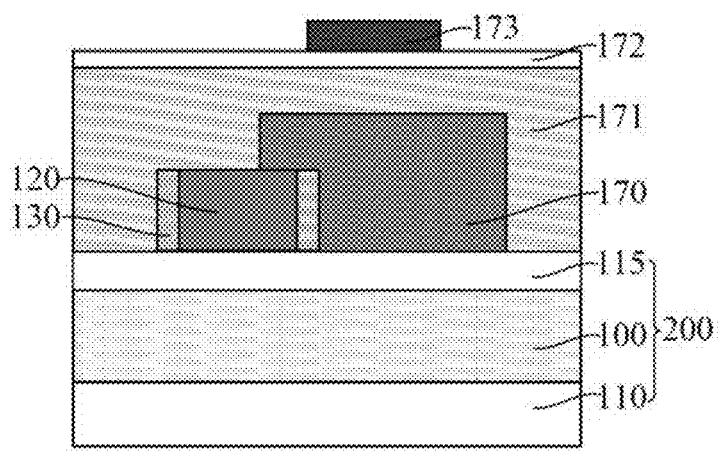
Figure 25:
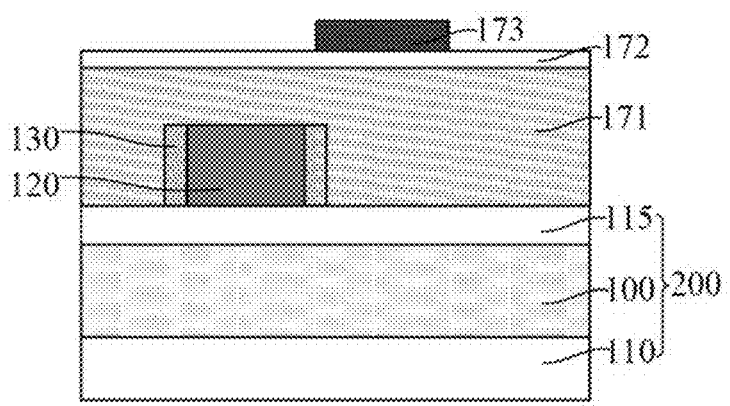
Figure 26:
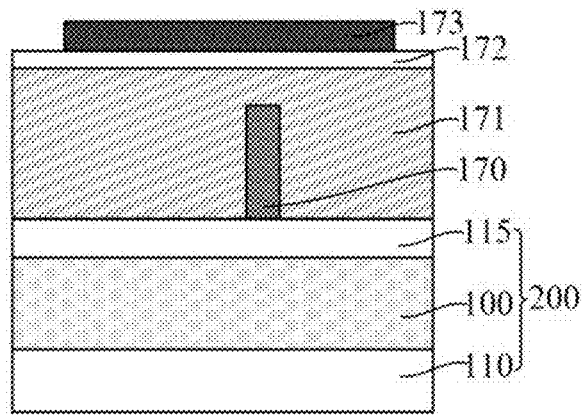

As shown in FIG. 23 to FIG. 26, FIG. 24 is a cross-sectional view of FIG. 23 along the section line y2-y2, FIG. 25 is a cross-sectional view of FIG. 23 along the section line y1-y1, and FIG. 26 is a cross-sectional view of FIG. 23 along the section line x-x. A sacrificial material layer 171 covering the mandrel layer 120 is formed on the base 200. For ease of illustration and description, shapes and positions of the mandrel layer 120, the mask spacer 130, and the first segmentation layer 170 are shown in FIG. 23 by using dashed line boxes.

The sacrificial material layer 171 is configured to form the sacrificial layer. In this form, the sacrificial material layer 171 is formed through a spin coating process. The spin coating process is simple in operation and low in process costs, and helps to improve the flatness of the top surface of the sacrificial material layer 171, which accordingly helps to improve the pattern transfer precision when the sacrificial material layer 171 is subsequently patterned.

In this form, the forming method further includes: forming a third anti-reflective coating 172 on the sacrificial material layer 171 and a third photoresist layer 173 on the third anti-reflective coating 172.

The third photoresist layer 173 is configured to define a size and a position of the sacrificial layer.

The third anti-reflective coating layer 172 is configured to reduce a reflection effect during exposure.

Figure 27:
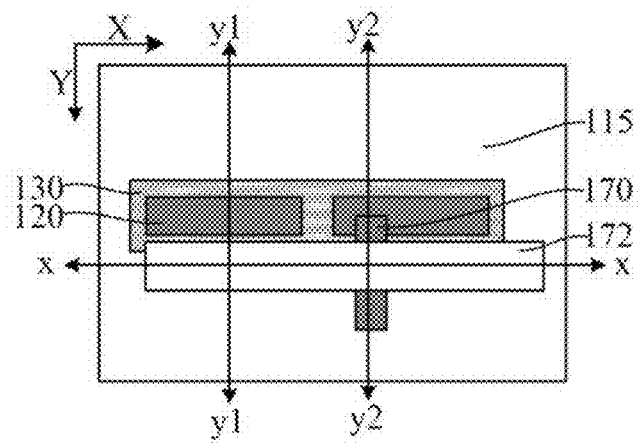
Figure 28:
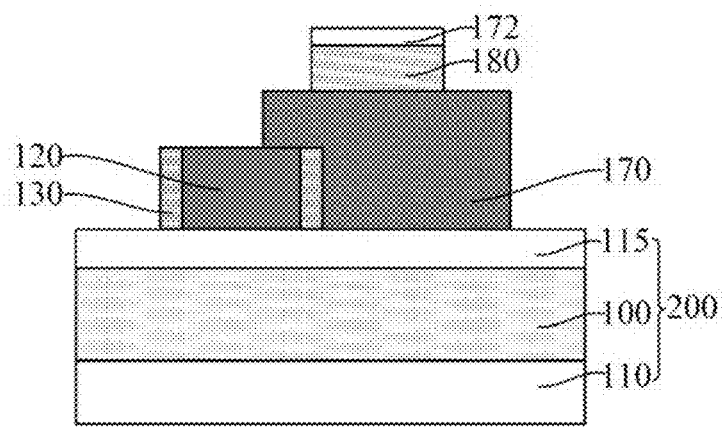
Figure 29:
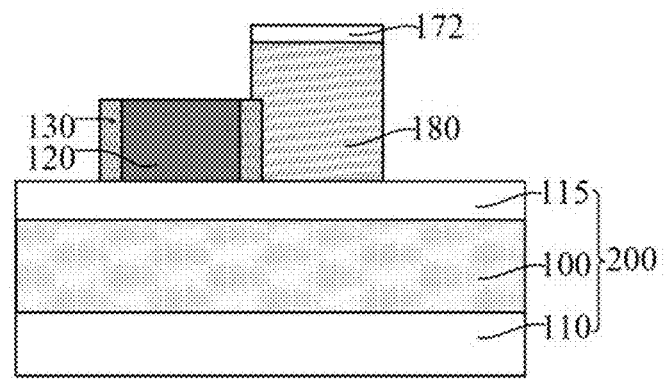
Figure 30:
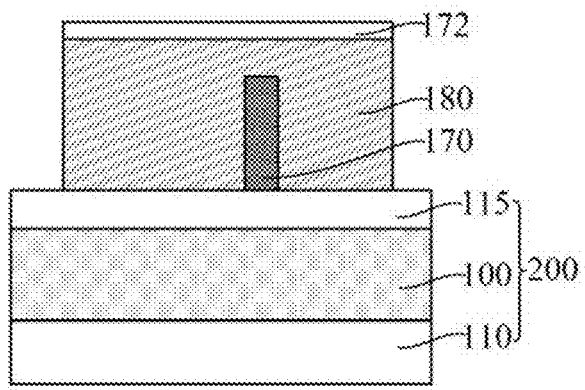

Referring to FIG. 27 to FIG. 30, FIG. 28 is a cross-sectional view of FIG. 27 along the section line y2-y2, FIG. 29 is a cross-sectional view of FIG. 27 along the section line y1-y1, and FIG. 30 is a cross-sectional view of FIG. 27 along the section line x-x. The sacrificial material layer 171 is patterned, and a part of the sacrificial material layer 171 adjacent to a side wall of the mandrel layer 120 along the first direction is reserved as the sacrificial layer 180.

In this form, a top surface of the sacrificial layer 180 is higher than a top surface of the mandrel layer 120, thereby omitting a step of removing the sacrificial layer 180 higher than the top surface of the mandrel layer 120, which helps to further simplify the process.

In this form, the third anti-reflective coating 172 and the sacrificial material layer 171 are sequentially etched by using the third photoresist layer 173 as a mask, and the remaining sacrificial material layer 171 is used as the sacrificial layer 180.

In this form, the third anti-reflective coating 172 and the sacrificial material layer 171 are sequentially etched by using an anisotropic dry etching process, thereby improving the pattern transfer precision.

In this form, in the step of etching the third anti-reflective coating 172 and the sacrificial material layer 171, the third photoresist layer 173 is also gradually consumed. Therefore, after the sacrificial layer 180 is formed, the third photoresist layer 173 has been removed.

Referring to FIG. 31 to FIG. 37, a planarization layer 210 is formed on the base 200 exposed from the sacrificial layer 180, the mandrel layer 120, the mask spacer 130, and the first segmentation layer 170. The planarization layer 210 is used, together with the mask spacer 130 and the first segmentation layer 170, as a mask for patterning the target layer 100.

The planarization layer 210 is made of a material that has etching selectivity with the material of the mandrel layer 120 and the sacrificial layer 180. In this form, the material of the planarization layer 210 includes silicon oxide, metal oxide (for example, titanium oxide), polysilicon, and amorphous silicon. In an example, the material of the planarization layer 210 is the same as the material of the first segmentation layer 170, so that the first segmentation layer 170 located on the mandrel layer 120 can be removed in a process of forming the planarization layer 210. Accordingly, the material of the planarization layer 210 is silicon oxide.

In this form, the step of forming the planarization layer 210 includes the following steps.

Figure 31:
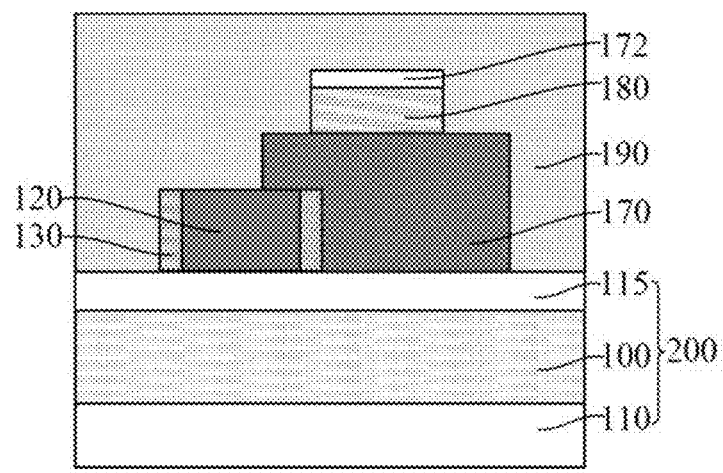
Figure 32:
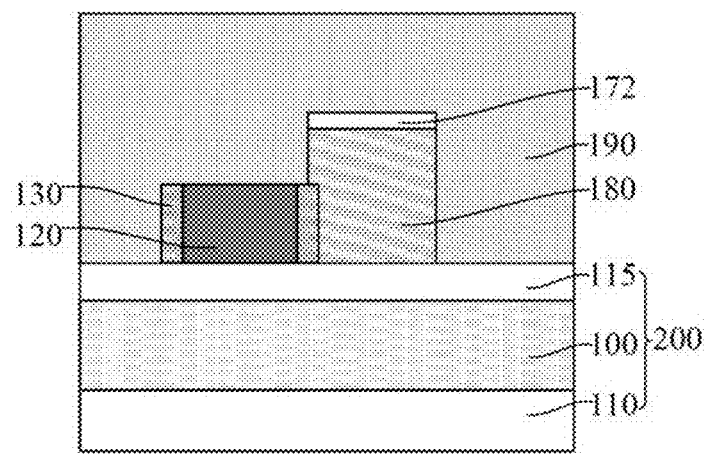
Figure 33:
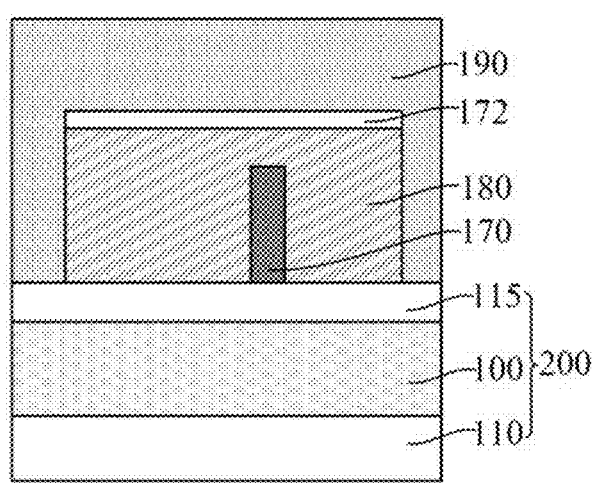

As shown in FIG. 31 to FIG. 33, FIG. 31 is a cross-sectional view based on FIG. 28, FIG. 32 is a cross-sectional view based on FIG. 29, and FIG. 33 is a cross-sectional view based on FIG. 30. A planarization material layer 190 covering the mandrel layer 120, the mask spacer 130, the sacrificial layer 180, and the first segmentation layer 170 is formed on the base 200.

A process of forming the planarization material layer 190 includes one or more of an atomic layer deposition process, a chemical vapor deposition process, and a spin coating process. In an example, the planarization material layer 190 is formed through a spin coating process. The spin coating process is simple in operation and low in process costs, and helps to improve flatness of the top surface of the planarization material layer 190.

Figure 34:
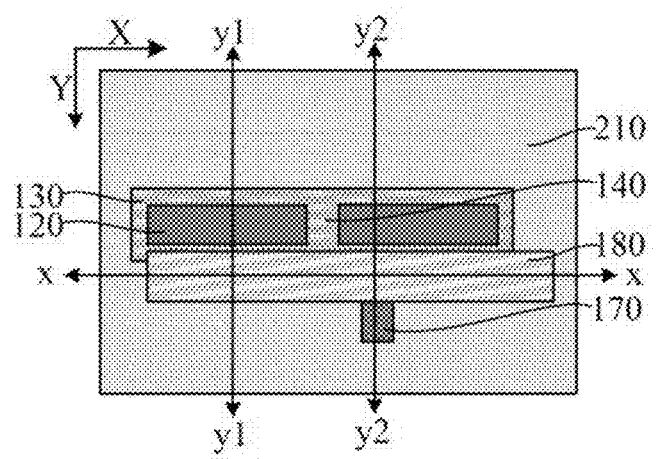
Figure 35:
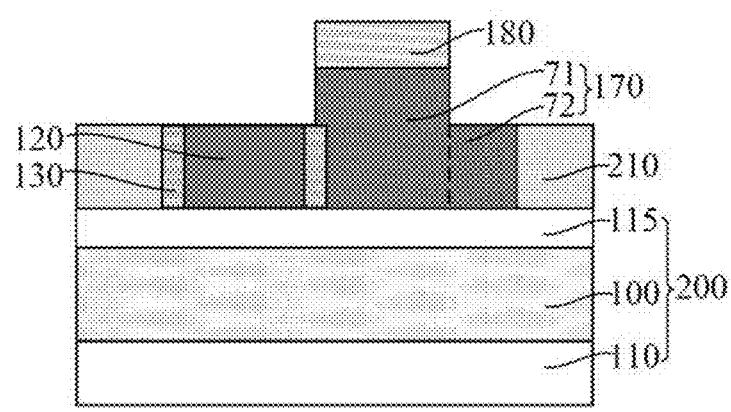
Figure 36:
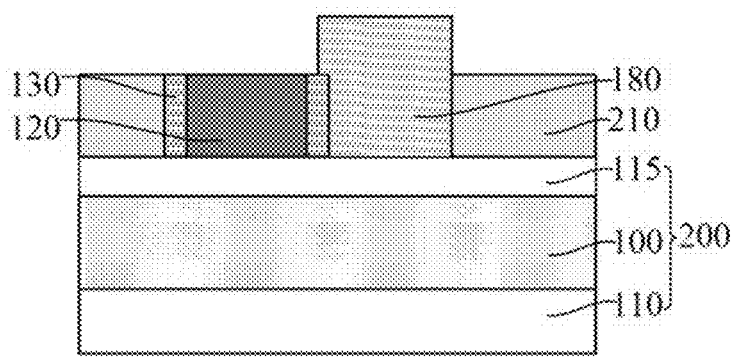
Figure 37:
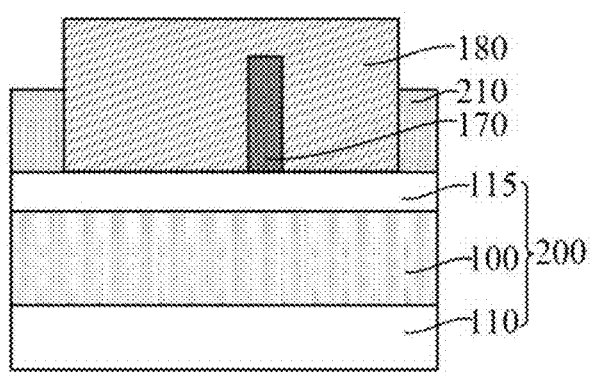

As shown in FIG. 34 to FIG. 37, FIG. 35 is a cross-sectional view of FIG. 34 along the section line y2-y2, FIG. 36 is a cross-sectional view of FIG. 34 along the section line y1-y1, and FIG. 37 is a cross-sectional view of FIG. 34 along the section line x-x. The planarization material layer 190 is etched back to expose the sacrificial layer 180.

The sacrificial layer 180 is exposed, so that in the same step, the planarization material layer 190 and the first segmentation layer 170 exposed by the sacrificial layer 180 can be subsequently etched, to further expose the top surface of the mandrel layer 120.

As shown in FIG. 34 to FIG. 37, a part of a thickness of the planarization material layer 190 and a part of a thickness of the first segmentation layer 170 that are exposed by the sacrificial layer 180 are etched to expose the top surface of the mandrel layer 120, and the remaining planarization material layer 190 is used as the planarization layer 210. Exposing the top surface of the mandrel layer 120 helps to remove the mandrel layer 120 subsequently.

In this form, in the same step, the part of the thickness of the planarization material layer 190 and the part of the thickness of the first segmentation layer 170 that are exposed by the sacrificial layer 180 are etched, so that a step of removing the first segmentation layer 170 located on the mandrel layer 120 does not need to be performed additionally, which helps to improve process integration and compatibility, and also helps to reduce process costs.

In this form, after the part of the thickness of the planarization material layer 190 and the part of the thickness of the first segmentation layer 170 that are exposed by the sacrificial layer 180 are etched, the first segmentation layer 170 includes a first part 71 (as shown in FIG. 35) located below the sacrificial layer 180 and a second part 72 (as shown in FIG. 35) protruding from the sacrificial layer 180, and a stop surface of the second part 72 is flush with the top surface of the mandrel layer 120, a top surface of the planarization layer 210, and a top surface of the mask spacer 130.

Figure 38:
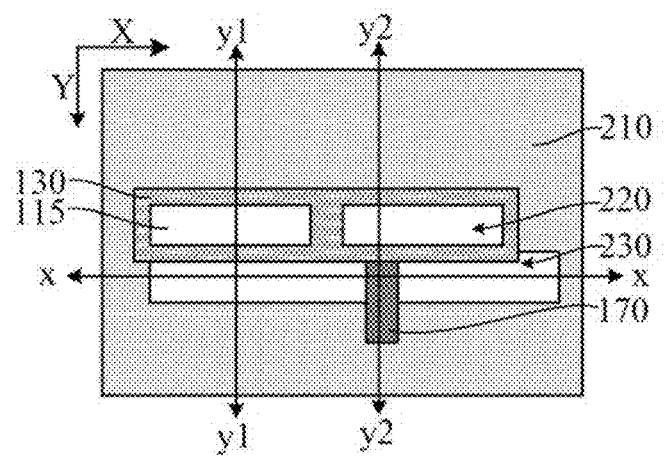
Figure 39:
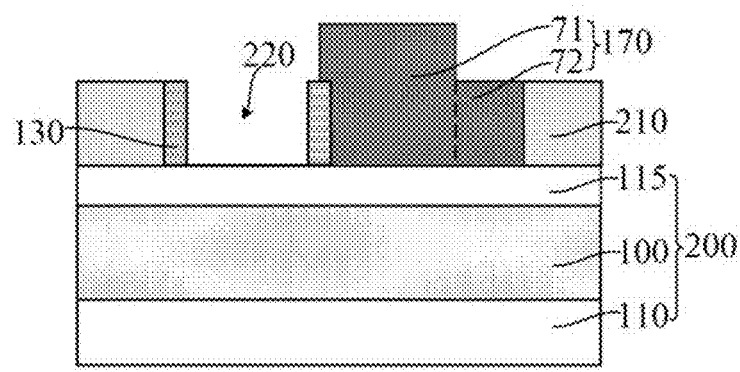
Figure 40:
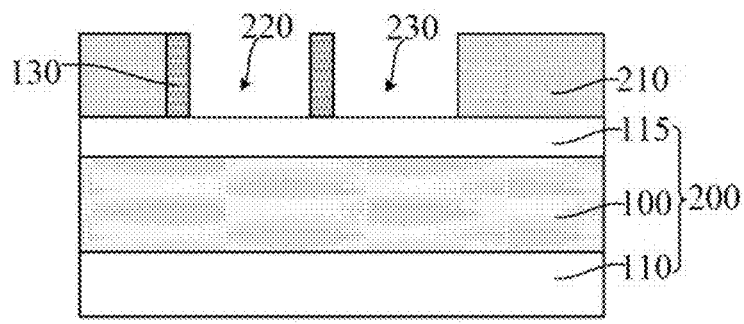
Figure 41:
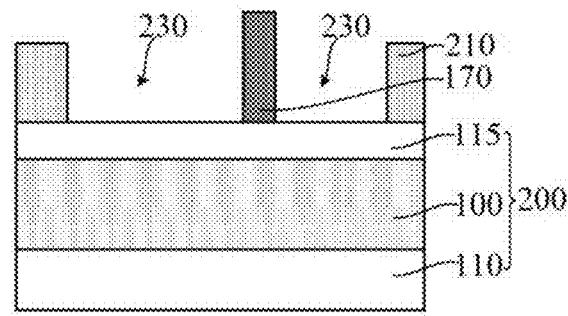

Referring to FIG. 38 to FIG. 41, FIG. 39 is a cross-sectional view of FIG. 38 along the section line y2-y2, FIG. 40 is a cross-sectional view of FIG. 38 along the section line y1-y1, and FIG. 41 is a cross-sectional view of FIG. 38 along the section line x-x. The sacrificial layer 180 is removed, and a first groove 230 is formed in the planarization layer 210, where the first groove 230 is segmented by the first segmentation layer 170 along the first direction (as shown by a direction x in FIG. 38).

The first groove 230 is configured to define a shape and a position of a part of the target pattern.

The first groove 230 is segmented by the first segmentation layer 170 along the first direction, which helps to implement a smaller pitch between adjacent first grooves 230 along the first direction. After the target layer 100 below the first groove 230 and the second groove is patterned to form a target pattern, a smaller pitch can also be implemented at the HTH position between adjacent target patterns, which helps to improve the flexibility and a degree of freedom of a layout design of the target pattern. Compared with directly segmenting the first groove through an etching process, this form helps to reduce the difficulty in segmenting the first groove 230 and enlarge a process window for cutting the first groove 230, and a size of the first groove 230 at the HTH position can be further accurately controlled by adjusting a size of the first segmentation layer 170, thereby helping to improve the pattern precision and pattern quality of the target pattern.

In this form, a process for removing the sacrificial layer 180 has a high etching selectivity ratio between the sacrificial layer 180 and the first segmentation layer 170, so that a probability that the first segmentation layer 170 is mistakenly etched is low, thereby preventing a pitch between the first grooves 230 from being enlarged at the HTH position, and accordingly accurately controlling the pitch between the first grooves 230 at the HTH position.

In this form, the material of the sacrificial layer 180 is SOC, and the sacrificial layer 180 is removed by using one or two of an ashing process and a wet stripping process.

Still referring to FIG. 38 to FIG. 41, the mandrel layer 120 is removed, and a second groove 220 is formed in the planarization layer 210. The second groove 220 and the first groove 230 are configured to define a shape and a position of the target pattern.

In this form, along the second direction, the first groove 230 and the second groove 220 are isolated by the mask spacer 130, which helps to make a pitch between the first groove 230 and the second groove 220 meet the designed minimum space.

In this form, the mask spacer 130 is an outer spacer. After the mandrel layer 120 is removed, and the second groove 220 is formed, a pitch between adjacent second grooves 220 along the first direction is defined by the mandrel layer 120. Compared with forming a groove first and then forming an inner spacer on a side wall of the groove, in this form, the pitch between adjacent second grooves along the first direction is not a sum of a pitch between adjacent mandrel layers and twice the thickness of the inner spacer, which helps to implement a smaller pitch between the adjacent second grooves 220 along the first direction. Accordingly, after the target layer 100 below the first groove 230 and the second groove 220 is patterned to form the target pattern, a smaller pitch between adjacent target patterns may be implemented at the HTH position, which helps to improve the flexibility and a degree of freedom of a layout design of the target pattern and further helps to reduce process costs.

In this form, a process of removing the mandrel layer 120 includes one or two of a wet etching process and a dry etching process. In an example, the mandrel layer 120 is removed by using a wet etching process. In this form, an etching solution of the wet etching process includes a tetramethylammonium hydroxide (TMAH) solution, an SC1 solution, or an SC2 solution. The SC1 solution refers to a mixed solution of $NH_4OH$ and $H_2O_2$, and the SC2 solution refers to a mixed solution of HCl and $H_2O_2$.

In this form, after the mandrel layer 120 is removed, the second groove 220 is segmented by the second segmentation layer 140 along the first direction, to implement a smaller pitch between adjacent second grooves 220.

Figure 42:
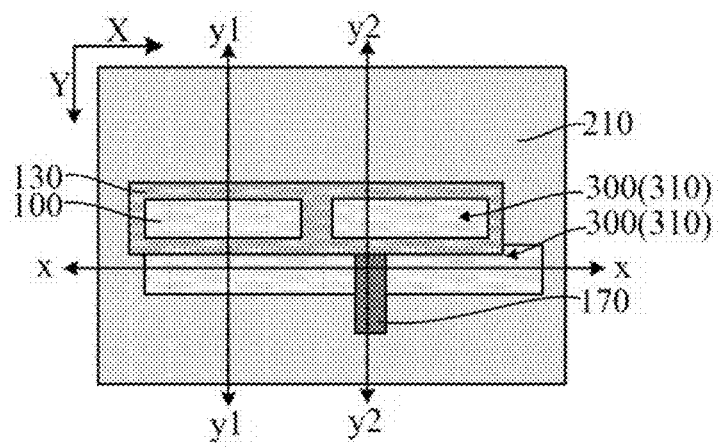
Figure 43:
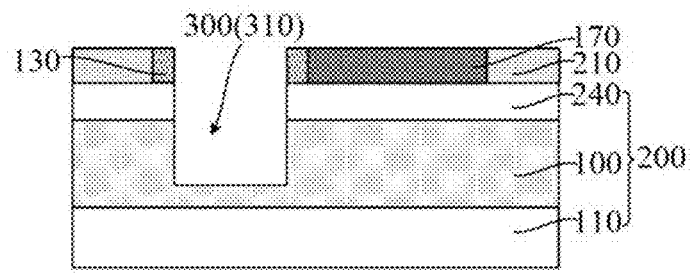
Figure 44:
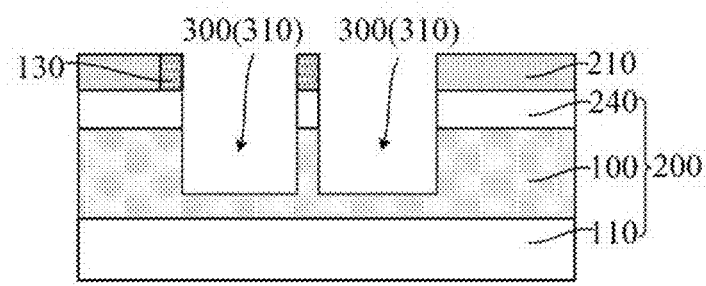
Figure 45:
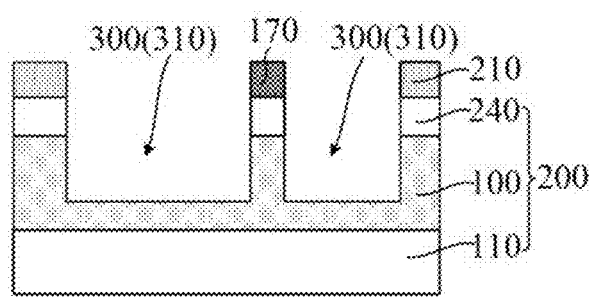

Referring to FIG. 42 to FIG. 45, FIG. 43 is a cross-sectional view of FIG. 45 along the section line y2-y2, FIG. 44 is a cross-sectional view of FIG. 42 along the section line y1-y1, and FIG. 45 is a cross-sectional view of FIG. 42 along the section line x-x. The target layer 100 below the first groove 230 and the second groove 220 is patterned by using the mask spacer 130, the segmentation layer 170, and the planarization layer 210 as a mask to form a target pattern 300.

As can be known from the above, both the first groove 230 and the second groove 220 have a relatively small pitch at the HTH position, so that when the target layer 100 below the first groove 230 and the second groove 220 is etched to form the target pattern 300, a smaller pitch can also be implemented between adjacent target patterns 300 at the HTH position, which helps to improve the flexibility and a degree of freedom of a layout design of the target pattern 300. Besides, along the second direction, a pitch between the first groove 230 and the second groove 220 may easily meet the designed minimum space, and further a pitch between the target patterns 300 may easily meet the designed minimum space. In addition, the first groove 230 and the second groove 220 have relatively high pattern precision, which accordingly helps to make the target pattern 300 have relatively high pattern precision.

In this form, the target layer 100 is a dielectric layer. Therefore, the dielectric layer below the first groove 230 and the second groove 220 is patterned using the mask spacer 130, the segmentation layer 170, and the planarization layer 210 as a mask to form an interconnect trench 310. Accordingly, the target pattern 300 is the interconnect trench 310. The interconnect trench 310 is configured to provide space for forming an interconnect line.

Specifically, in this form, the hard mask material layer 115 below the first groove 230 and the second groove 220 is patterned using the mask spacer 130, the segmentation layer 170, and the planarization layer 210 as a mask to form a hard mask layer 240; and the dielectric layer is patterned by using the hard mask layer 240 as a mask to form the interconnect trench 310.

Figure 46:
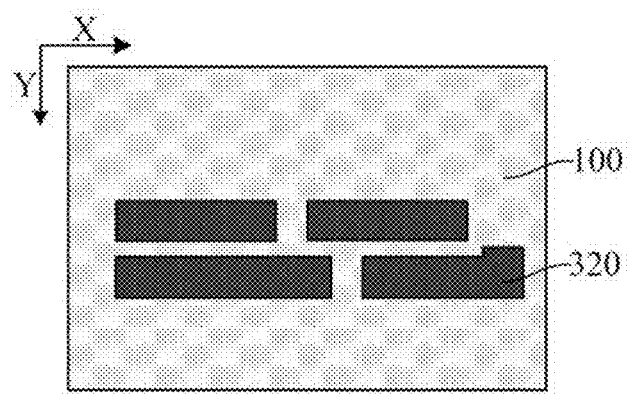

Referring to FIG. 46, in this form, the forming method of a semiconductor structure further includes: forming an interconnect line 320 in the interconnect trench 310 after the interconnect trench 310 is formed.

In this form, a relatively small pitch between the interconnect trenches 310 may be implemented at the HTH position, and a relatively small pitch may be also implemented between the interconnect lines 320 at the HTH position accordingly, which helps to improve a connectivity capability of the interconnect lines 320 at the HTH position, and also helps to improve a degree of freedom and the flexibility of a layout design of the interconnect line 320. In addition, a pitch between adjacent interconnect trenches 310 may easily meet the designed minimum space in the second direction, and the pattern precision of the interconnect trench 310 is relatively high, which accordingly helps to make a pitch between the interconnect lines 320 in the second direction meet the designed minimum space and improve the pattern precision of the interconnect line 320, thereby further improving the performance of the semiconductor structure.

The interconnect line 320 is configured to electrically connect the semiconductor structure to an external circuit or another interconnect structure. In this form, a material of the interconnect line 320 is copper. In other forms, the material of the interconnect line may alternatively be a conductive material such as cobalt, tungsten, or aluminum. In this form, in the step of forming the interconnect line 320, the planarization layer 210, the mask spacer 130, the first segmentation layer 170, and the hard mask layer 240 are further removed, to prepare for subsequent processes.

Accordingly, the present disclosure further provides a semiconductor structure. Referring to FIG. 34 to FIG. 37, FIG. 35 is a cross-sectional view of FIG. 34 along the section line y2-y2, FIG. 36 is a cross-sectional view of FIG. 34 along the section line y1-y1, and FIG. 37 is a cross-sectional view of FIG. 34 along the section line x-x. A schematic structural diagram of one form of the semiconductor structure of the present disclosure is shown.

One form of a semiconductor structure includes: a base 200, including a target layer 100 used for forming a target pattern; a mandrel layer 120, located on the base 200 and extending along a first direction (as shown by a direction X in FIG. 34), where a direction (as shown by a direction Y in FIG. 34) perpendicular to the first direction is a second direction; a mask spacer 130, located on a side wall of the mandrel layer 120; a first segmentation layer 170, extending along the second direction, where the first segmentation layer 170 is in contact with a side wall of the mask spacer 130 along the first direction; a sacrificial layer 180, extending along the first direction and arranged spaced from the mandrel layer 120 along the second direction, where the sacrificial layer 180 covers the side wall of the mask spacer 130 along the first direction, and along the first direction, the sacrificial layer 180 protrudes from two sides of the first segmentation layer 170 and covers a part of a side wall of the first segmentation layer 170; and a planarization layer 210, located on the base 200 and covering the sacrificial layer 180, the mandrel layer 120, the mask spacer 130, and the side wall of the first segmentation layer 170, where the planarization layer 210 exposes a top surface of the sacrificial layer 180 and a top surface of the mandrel layer 120.

The sacrificial layer 180 is configured to occupy a spatial position for forming a first groove. The mandrel layer 120 is configured to occupy a spatial position for forming a second groove.

The first segmentation layer 170 is configured to segment the sacrificial layer 180 along the first direction, so that after the sacrificial layer 180 is subsequently removed to form the first groove, the first groove is accordingly segmented by the first segmentation layer 170 along the first direction, which helps to implement a smaller pitch between adjacent first grooves along the first direction. After the target layer 100 below the first groove and the second groove is patterned to form a target pattern, a smaller pitch can also be implemented at the HTH position between adjacent target patterns, which helps to improve the flexibility and a degree of freedom of a layout design of the target pattern. Compared with directly segmenting the first groove through an etching process, this embodiment helps to reduce the difficulty in segmenting the first groove and enlarge a process window for cutting the first groove, and a size of the first groove at the HTH position can be further accurately controlled by adjusting a size of the first segmentation layer 170, thereby helping to improve the pattern precision and pattern quality of the target pattern.

In addition, in this form, the mask spacer 130 is located on an outer side wall of the mandrel layer 120, and the mask spacer 130 is an outer spacer. After the second groove is formed, a pitch between adjacent second grooves along the first direction is defined by the mandrel layer 120, compared with forming a groove first and then forming an inner spacer on a side wall of the groove, in this form, the pitch between adjacent second grooves along the first direction is not a sum of a pitch between adjacent mandrel layers and twice the thickness of the inner spacer, which helps to implement a smaller pitch between the adjacent second grooves along the first direction. Accordingly, after the target layer below the first groove and the second groove is patterned to form the target pattern, a smaller pitch between adjacent target patterns may be implemented at the HTH position, which helps to improve the flexibility and a degree of freedom of a layout design of the target pattern and further helps to reduce process costs.

The base 200 is configured to provide a platform for process procedures. The target layer 100 is a to-be-patterned film layer for forming the target pattern. The target pattern may be a pattern such as a gate structure, an interconnect trench in the back end of line, a fin in a fin field-effect transistor (FinFET), a channel stack in a gate-all-around (GAA) transistor or a forksheet transistor, or a hard mask (HM) layer.

In this form, the target layer 100 is a dielectric layer. Subsequently, the dielectric layer is patterned, a plurality of interconnect trenches is formed in the dielectric layer, and then interconnect lines are formed in the interconnect trenches, where the dielectric layer is configured to implement electrical isolation between adjacent interconnect lines. Accordingly, in this form, the target pattern is an interconnect trench. Therefore, the dielectric layer is an IMD layer. A material of the dielectric layer is a low-k dielectric material, an ultra low-k dielectric material, silicon oxide, silicon nitride, silicon oxynitride, or the like.

Accordingly, in this form, semiconductor devices, such as a transistor and a capacitor, may be formed in the base 200, and functional structures, such as a resistance structure and a conductive structure, may also be formed in the base 200. In this form, the base 200 further includes a substrate 110 located at a bottom of the target layer 100.

In this form, the base 200 further includes a hard mask material layer 115 located above the target layer 100. Subsequently, the hard mask material layer 115 is first patterned to form a hard mask layer, and then the target layer 100 is patterned using the hard mask layer as a mask, which helps to improve the process stability of patterning the target layer 100 and accordingly improve pattern transfer precision. A material of the hard mask material layer 115 includes one or more of titanium nitride, tungsten carbide, silicon oxide, silicon oxycarbide, and silicon oxycarbonitride.

The mandrel layer 120 is configured to occupy a spatial position for formation of a second groove to define a pattern and a position of the second groove. The mandrel layer 120 further provides support for formation of the mask spacer 130.

In this form, a material of the mandrel layer 120 is a material that may be easily removed, thereby reducing the difficulty in removing the mandrel layer 120 subsequently. The mandrel layer 120 is a single-layer structure or a multiple-layer structure, and the material of the mandrel layer 120 includes one or more of amorphous silicon, polysilicon, silicon oxide, amorphous carbon, silicon nitride, amorphous germanium, silicon oxynitride, carbon nitride, silicon carbonitride, and silicon oxycarbonitride. In an example, the mandrel layer 120 is a single-layer structure, and the material of the mandrel layer 120 is amorphous silicon.

In this form, the semiconductor structure further includes: a second segmentation layer 140 running through the mandrel layer 120 along the second direction. The mandrel layer 120 is segmented by the second segmentation layer 140 along the first direction.

The second segmentation layer 140 is configured to segment the mandrel layer 120 along the first direction, to implement a smaller pitch between adjacent mandrel layers 120 along the first direction and implement a smaller pitch between adjacent target patterns at the HTH position.

In an example, the semiconductor structure further includes: a cutting groove 20 (as shown in FIG. 4) running through the mandrel layer 120 along the second direction. The mask spacer 130 is filled in the cutting groove 20, and the mask spacer 130 located in the cutting groove 20 is used as the second segmentation layer 140. Accordingly, in this form, a material of the second segmentation layer 140 is the same as a material of the mask spacer 130.

In other forms, the material of the second segmentation layer is the same as the material of the mandrel layer, and the second segmentation layer is doped with an ion, where the ion is adapted to make etch resistance of the second segmentation layer greater than etch resistance of the mandrel layer. The ion doping is adapted to make the etching resistance of the second segmentation layer greater than the etching resistance of the mandrel layer, and an etching selectivity ratio between the mandrel layer and the second segmentation layer is accordingly increased, so that the second segmentation layer can be reserved in a process of removing the mandrel layer to form the second groove, and the second segmentation layer can segment the second groove. Specifically, an ion of the ion doping includes one or more of a boron ion, a phosphorus ion, and an argon ion. The material of the second segmentation layer is the same as the material of the mandrel layer and includes one or more of amorphous silicon, polysilicon, silicon oxide, amorphous carbon, silicon nitride, amorphous germanium, silicon oxynitride, carbon nitride, silicon carbonitride, and silicon oxycarbonitride; and the doped ion includes one or more of a boron ion, a phosphorus ion, and an argon ion.

The mask spacer 130 is used as a mask for subsequently patterning the target layer 100.

After the first groove and the second groove are formed, the mask spacer 130 is further configured to isolate the first groove and the second groove that are adjacent to each other. In addition, in this form, a pitch between the first groove and the second groove may be further made to meet a designed minimum space by adjusting a thickness of the mask spacer 130 subsequently.

The mask spacer 130 is made of a material that has etching selectivity with the mandrel layer 120, the sacrificial layer 180, and the target layer 100, and the material of the mask spacer 130 includes one or more of titanium oxide, silicon oxide, silicon nitride, silicon carbide, silicon oxycarbide, aluminum oxide, and amorphous silicon.

The first segmentation layer 170 is configured to segment the sacrificial layer 180 along the first direction, so that after the sacrificial layer 180 is subsequently removed to form the first groove, the first groove is accordingly segmented by the first segmentation layer 170 along the first direction, which helps to implement a smaller pitch between adjacent first grooves along the first direction. After the target layer 100 below the first groove and the second groove is patterned to form a target pattern, a smaller pitch can also be implemented at the HTH position between adjacent target patterns, which helps to improve the flexibility and a degree of freedom of a layout design of the target pattern. Compared with directly segmenting the first groove through an etching process, this embodiment helps to reduce the difficulty in segmenting the first groove and enlarge a process window for cutting the first groove, and a size of the first groove at the HTH position can be further accurately controlled by adjusting a size of the first segmentation layer 170, thereby helping to improve the pattern precision and pattern quality of the target pattern.

The first segmentation layer 170 is made of a material that has etching selectivity with the mandrel layer 120 and the sacrificial layer 180. In this form, the material of the first segmentation layer 170 includes one or more of silicon oxide, metal oxide (for example, titanium oxide), polysilicon, and amorphous silicon. In an example, the material of the first segmentation layer 170 is the same as the material of the planarization layer 210, and the material of the first segmentation layer 170 is silicon oxide.

In this form, the first segmentation layer 170 includes a first part 71 located below the sacrificial layer 180 and a second part 72 protruding from the sacrificial layer 180, and a stop surface of the second part 72 is flush with the top surface of the mandrel layer 120, a top surface of the planarization layer 210, and a top surface of the mask spacer 130. In the step of forming the planarization layer 210, the second part 72 is formed by etching a part of a thickness of the first segmentation layer 170 and a part of a thickness of the planarization layer 210 by using the sacrificial layer 180 as a mask.

The sacrificial layer 180 is configured to occupy space for formation of a first groove, and accordingly, the sacrificial layer 180 is configured to define a pattern and a position of the first groove. Compared with a solution of directly forming the first groove through an etching process, subsequently removing the sacrificial layer 180 to form the first groove helps to reduce the difficulty in forming the first groove, and accordingly helps to ensure the pattern precision of the first groove.

In this form, the sacrificial layer 180 is segmented by the first segmentation layer 170 along the first direction, so that after the sacrificial layer 180 is subsequently removed to form a first groove, the first groove is accordingly segmented by the first segmentation layer 170 along the first direction, which helps to implement a smaller pitch between adjacent first grooves along the first direction. After the target layer 100 below the first groove and the second groove is patterned to form a target pattern, a smaller pitch can also be implemented at the HTH position between adjacent target patterns.

In this form, the sacrificial layer 180 and the mandrel layer 120 are isolated by the mask spacer 130, which helps to make a pitch between the sacrificial layer 180 and the mandrel layer 120 meet the designed minimum space, and accordingly make a pitch between the second groove and the first groove meet the designed minimum space.

The sacrificial layer 180 is a single-layer structure or a laminated structure, and a material of the sacrificial layer 180 includes one or more of SOC, silicon oxide, metal oxide, an organic dielectric layer material, and an advanced patterning film material. The silicon oxide includes SOG; and the metal oxide includes spin-on metal oxide. The material of the sacrificial layer 180 is applicable to a spin coating process, which helps to reduce the difficulty in forming the sacrificial layer 180 and improve the flatness of the top surface of the sacrificial layer 180. In this form, the material of the sacrificial layer 140 is SOC. The filling performance of SOC is relatively good, and SOC material may be easily etched, which helps to reduce the difficulty in forming the sacrificial layer 180.

In this form, the sacrificial layer 180 further covers a part of a top portion of the first segmentation layer 170.

The planarization layer 210 is used, together with the mask spacer 130 and the first segmentation layer 170, as a mask for patterning the target layer 100. The planarization layer 210 is made of a material that has etching selectivity with the material of the mandrel layer 120 and the sacrificial layer 180. In this form, the material of the planarization layer 210 includes silicon oxide, metal oxide (for example, titanium oxide), polysilicon, and amorphous silicon. In an example, the material of the planarization layer 210 is the same as the material of the first segmentation layer 170, so that the first segmentation layer 170 located on the mandrel layer 120 can be removed in a process of forming the planarization layer 210. Accordingly, the material of the planarization layer 210 is silicon oxide.

The semiconductor structure may be formed using the forming method described in the foregoing embodiments and implementations, or may be formed using other forming methods. For detailed descriptions of the semiconductor structure in this form, reference may be made to corresponding descriptions in the foregoing forms as details are not described herein.

Although forms of the present disclosure are disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A forming method of a semiconductor structure, comprising:
   providing a base, comprising a target layer used for forming a target pattern;
   forming a mandrel layer extending along a first direction on the base, wherein a direction perpendicular to the first direction is a second direction;
   forming a mask spacer on a side wall of the mandrel layer;
   forming a first segmentation layer extending along the second direction, wherein the first segmentation layer is in contact with a side wall of the mask spacer along the first direction;
   forming a sacrificial layer extending along the first direction and arranged spaced from the mandrel layer along the second direction, wherein the sacrificial layer covers the side wall of the mask spacer along the first direction, and along the first direction, the sacrificial layer protrudes from two sides of the first segmentation layer and covers a part of a side wall of the first segmentation layer;
   forming a planarization layer on the base exposed from the sacrificial layer, the mandrel layer, the mask spacer, and the first segmentation layer;
   removing the sacrificial layer to form a first groove in the planarization layer, wherein the first groove is segmented by the first segmentation layer along the first direction;
   removing the mandrel layer to form a second groove in the planarization layer; and
   patterning the target layer below the first groove and the second groove using the mask spacer, the first segmentation layer, and the planarization layer as a mask to form the target pattern.

2. The forming method of a semiconductor structure according to claim 1, wherein the step of forming the first segmentation layer comprises:
   forming a support layer on the base exposed from the mandrel layer and the mask spacer;
   forming a cutting opening extending along the second direction in the support layer, wherein the cutting opening exposes a part of the side wall of the mask spacer along the first direction and a part of the base;
   forming the first segmentation layer in the cutting opening; and
   removing the support layer.

3. The forming method of a semiconductor structure according to claim 2, wherein a process of forming the first segmentation layer comprises at least one of a spin coating process, an atomic layer deposition process, or a chemical vapor deposition process.

4. The forming method of a semiconductor structure according to claim 1, wherein:
   after the mandrel layer is formed, and before the mask spacer is formed, the forming method of a semiconductor structure further comprises: forming a cutting groove running through the mandrel layer along the second direction, wherein the mandrel layer is segmented by the cutting groove along the first direction;
   in the step of forming the mask spacer, the mask spacer is filled in the cutting groove, and the mask spacer located in the cutting groove is used as a second segmentation layer; and
   the second groove is segmented by the second segmentation layer along the first direction after the mandrel layer is removed.

5. The forming method of a semiconductor structure according to claim 1, wherein after the mandrel layer is formed, and before the mask spacer is formed, the forming method of a semiconductor structure further comprises:
   performing ion doping on a part of the mandrel layer, wherein the ion doping is adapted to improve etching resistance of the mandrel layer, and the ion-doped mandrel layer is used as a second segmentation layer; and the mandrel layer is segmented by the second segmentation layer along the first direction.

6. The forming method of a semiconductor structure according to claim 1, wherein in the step of forming the first segmentation layer, the first segmentation layer further extends to cover a part of a top portion of the mask spacer and a part of a top portion of the mandrel layer along the second direction.

7. The forming method of a semiconductor structure according to claim 6, wherein:
   in the step of forming the sacrificial layer, the sacrificial layer further covers a part of a top portion of the first segmentation layer; and
   the step of forming the planarization layer comprises:
      forming a planarization material layer covering the mandrel layer, the mask spacer, the sacrificial layer, and the first segmentation layer on the base;
      etching back the planarization material layer to expose the sacrificial layer; and
      etching a part of a thickness of the planarization material layer and a part of a thickness of the first segmentation layer exposed from the sacrificial layer to expose a top surface of the mandrel layer, wherein the remaining planarization material layer is used as the planarization layer.

8. The forming method of a semiconductor structure according to claim 7, wherein a material of the planarization layer is the same as a material of the first segmentation layer.

9. The forming method of a semiconductor structure according to claim 1, wherein a material of the first segmentation layer comprises at least one of silicon oxide, metal oxide, polysilicon, or amorphous silicon.

10. The forming method of a semiconductor structure according to claim 1, wherein a material of the sacrificial layer comprises at least one of silicon oxide, metal oxide, spin-on carbon, an advanced patterning film, or an organic dielectric layer.

11. The forming method of a semiconductor structure according to claim 1, wherein:
    the target layer is a dielectric layer, and the target pattern is an interconnect trench; and
    the forming method of a semiconductor structure further comprises: forming an interconnect line in the interconnect trench after the interconnect trench is formed.

* * * * *